(12) United States Patent
Perumkunnil et al.

(10) Patent No.: US 11,822,475 B2
(45) Date of Patent: Nov. 21, 2023

(54) INTEGRATED CIRCUIT WITH 3D PARTITIONING

(71) Applicant: IMEC VZW, Leuven (BE)

(72) Inventors: Manu Komalan Perumkunnil, Leuven (BE); Geert Van der Plas, Leuven (BE)

(73) Assignee: Imec vzw, Leuven (BE)

( * ) Notice: Subject to any disclaimer, the term of this patent is extended or adjusted under 35 U.S.C. 154(b) by 0 days.

(21) Appl. No.: 17/565,594

(22) Filed: Dec. 30, 2021

(65) Prior Publication Data

US 2022/0214972 A1 Jul. 7, 2022

(30) Foreign Application Priority Data

Jan. 4, 2021 (EP) .................... 21150062

(51) Int. Cl.
*G06F 12/0815* (2016.01)
*G06F 12/1027* (2016.01)
*G06F 12/0875* (2016.01)

(52) U.S. Cl.
CPC ...... *G06F 12/0815* (2013.01); *G06F 12/0875* (2013.01); *G06F 12/1027* (2013.01)

(58) Field of Classification Search
None
See application file for complete search history.

(56) References Cited

U.S. PATENT DOCUMENTS

| | | | |
|---|---|---|---|
| 8,386,690 B2 | 2/2013 | Li et al. | |
| 9,170,948 B2 | 10/2015 | Loh et al. | |
| 9,432,298 B1 | 8/2016 | Smith | |
| 9,583,473 B2 | 2/2017 | Du | |
| 9,871,020 B1 | 1/2018 | Ventrone et al. | |
| 2004/0212395 A1 | 10/2004 | Madurawe | |
| 2008/0288720 A1 | 11/2008 | Atwal et al. | |
| 2014/0181427 A1 | 6/2014 | Jayasena et al. | |
| 2015/0019802 A1 | 1/2015 | Kamal et al. | |
| 2015/0160975 A1 | 6/2015 | Xu et al. | |
| 2015/0199266 A1 | 7/2015 | Franchetti et al. | |

(Continued)

FOREIGN PATENT DOCUMENTS

| | | |
|---|---|---|
| WO | 2018071143 A2 | 4/2018 |
| WO | 2018071143 A3 | 4/2018 |

OTHER PUBLICATIONS

Extended European Search Report and Written Opinion, Application No. EP21150062.4, dated Jul. 14, 2021, 8 pages.

(Continued)

*Primary Examiner* — Kaushikkumar M Patel
(74) *Attorney, Agent, or Firm* — McDonnell Boehnen Hulbert & Berghoff LLP

(57) ABSTRACT

Example embodiments relate to integrated circuits with 3D partitioning. One embodiment includes an integrated circuit. The integrated circuit includes a first integrated circuit layer that includes processing cores. The integrated circuit also includes a second integrated circuit layer that includes memory arrays associated with processing cores. Additionally, the integrated circuit includes an intermediate integrated circuit layer interconnected with the first and second integrated circuit layers and including memory control logic and interface circuitries for managing data exchange between the processing cores and the memory arrays.

20 Claims, 5 Drawing Sheets

(56) References Cited

U.S. PATENT DOCUMENTS

| | | | |
|---|---|---|---|
| 2017/0139635 A1 | 5/2017 | Jayasena et al. | |
| 2017/0221858 A1 | 8/2017 | Yu et al. | |
| 2017/0344479 A1 | 11/2017 | Boyer et al. | |
| 2018/0107591 A1 | 4/2018 | Smith | |
| 2019/0114265 A1* | 4/2019 | Chang | G06F 9/3877 |
| 2019/0196742 A1 | 6/2019 | Yudanov et al. | |
| 2019/0244933 A1 | 8/2019 | Or-Bach et al. | |
| 2022/0100247 A1* | 3/2022 | Garg | G06F 1/30 |

OTHER PUBLICATIONS

Zhao, Bo, Yu Du, Youtao Zhang, and Jun Yang. "Variation-tolerant non-uniform 3D cache management in die stacked multicore processor." in Proceedings of the 42nd Annual IEEE/ACM International Symposium on Microarchitecture, pp. 222-231. 2009.

Woo, Dong Hyuk, Nak Hee Seong, Dean L. Lewis, and Hsien-Hsin S. Lee. "An optimized 3D-stacked memory architecture by exploiting excessive, high-density TSV bandwidth." in HPCA-16 2010 the Sixteenth International Symposium on High-Performance Computer Architecture, pp. 1-12. IEEE, 2010.

Zhu, Qiuling, Berkin Akin, H. Ekin Sumbul, Fazle Sadi, James C. Hoe, Larry Pileggi, and Franz Franchetti. "A 3D-stacked logic-in-memory accelerator for application-specific data intensive computing." in 2013 IEEE international 3D systems integration conference (3DIC), pp. 1-7. IEEE, 2013.

Jung, Jongpil, Seonpil Kim, and Chong-Min Kyung. "Latency-aware utility-based NUCA cache partitioning in 3D-stacked multiprocessor systems." in 2010 18th IEEE/IFIP International Conference on VLSI and System-on-Chip, pp. 125-130. IEEE, 2010.

Vijayaraghavan, Thiruvengadam, Yasuko Eckert, Gabriel H. Loh, Michael J. Schulte, Mike Ignatowski, Bradford M. Beckmann, William C. Brantley et al. "Design and Analysis of an APU for Exascale Computing." in 2017 IEEE International Symposium on High Performance Computer Architecture (HPCA), pp. 85-96. IEEE, 2017.

Naffziger, Samuel, Kevin Lepak, Milam Paraschou, and Mahesh Subramony. "2.2 AMD chiplet architecture for high-performance server and desktop products." in 2020 IEEE International Solid-State Circuits Conference-(ISSCC), pp. 44-45. IEEE, 2020.

Black, Bryan, Murali Annavaram, Ned Brekelbaum, John DeVale, Lei Jiang, Gabriel H. Loh, Don McCaule et al. "Die stacking (3D) microarchitecture." in 2006 39th Annual IEEE/ACM International Symposium on Microarchitecture (MICRO'06), pp. 469-479. IEEE, 2006.

Giridhar, Bharan, Michael Cieslak, Deepankar Duggal, Ronald Dreslinski, Hsing Min Chen, Robert Patti, Betina Hold, Chaitali Chakrabarti, Trevor Mudge, and David Blaauw. "Exploring DRAM organizations for energy-efficient and resilient exascale memories." in Proceedings of the International Conference on High Performance Computing, Networking, Storage and Analysis, pp. 1-12. 2013.

Poremba, Matthew, Itir Akgun, Jieming Yin, Onur Kayiran, Yuan Xie, and Gabriel H. Loh. "There and back again: Optimizing the interconnect in networks of memory cubes." ACM SIGARCH Computer Architecture News 45, No. 2 (2017): 678-690.

Kim, Gwangsun, John Kim, Jung Ho Ahn, and Yongkee Kwon. "Memory Network: Enabling Technology for Scalable Near-Data Computing." in Proceedings of the 2nd Workshop on Near-Data Processing. 2014.

Chen, W. Chris, Clark Hu, K. C. Ting, Vincent Wei, T. H. Yu, S. Y. Huang, V. C. Y. Chang et al. "Wafer level integration of an advanced logic-memory system through 2 nd generation CoWoS® technology." in 2017 Symposium on VLSI Technology, pp. T54-T55. IEEE, 2017.

* cited by examiner

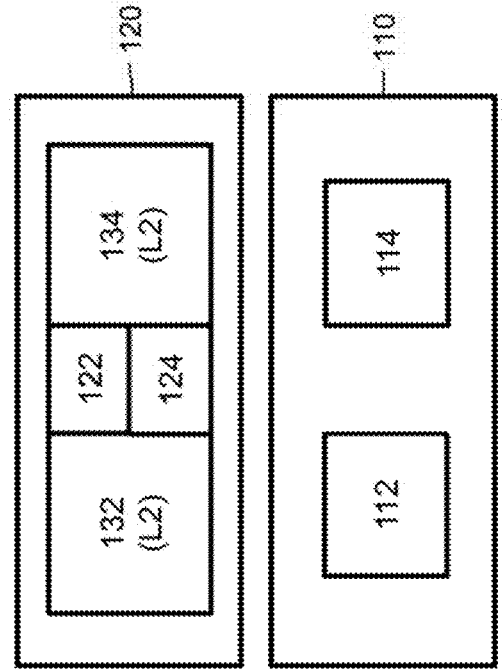
FIG. 1A (Prior Art)
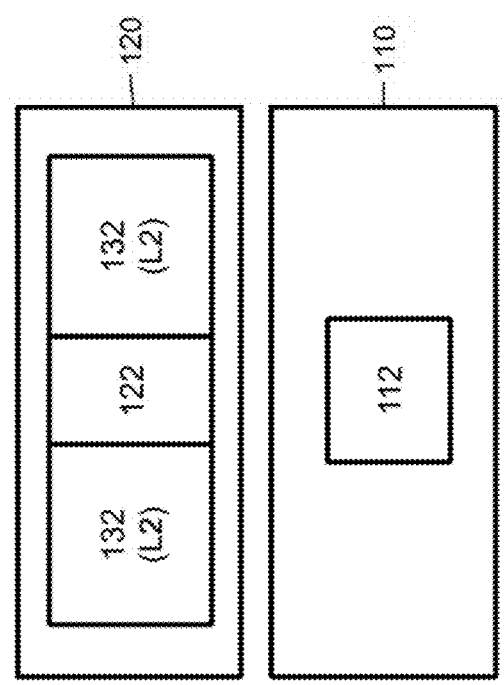
FIG. 1B (Prior Art)
FIG. 2A (Prior Art)
FIG. 2B (Prior Art)

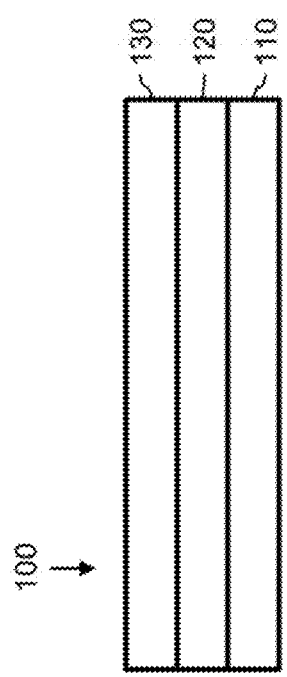
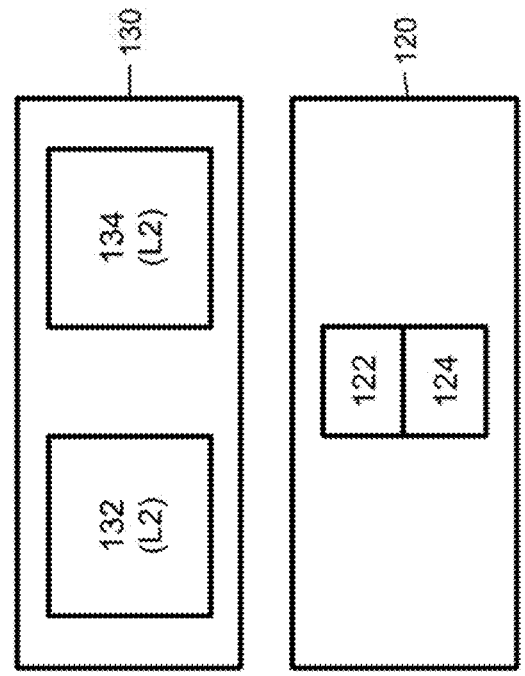
FIG. 3A
FIG. 3B
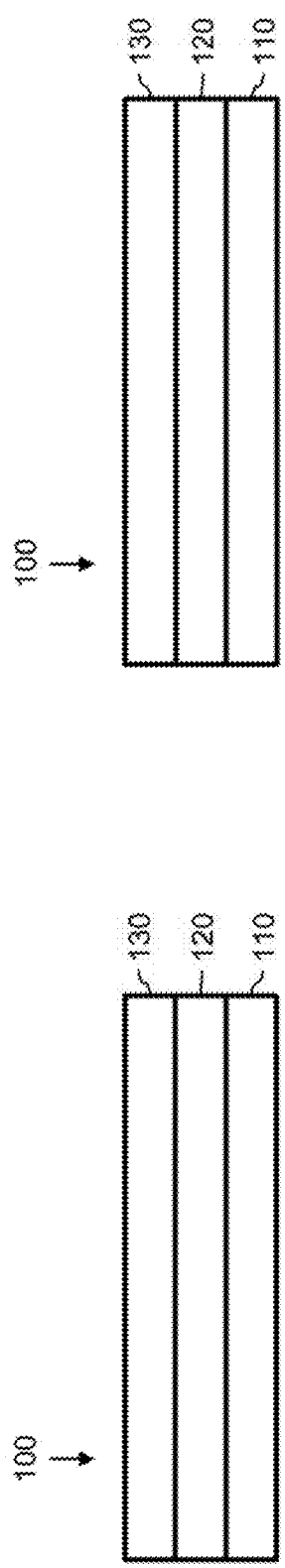
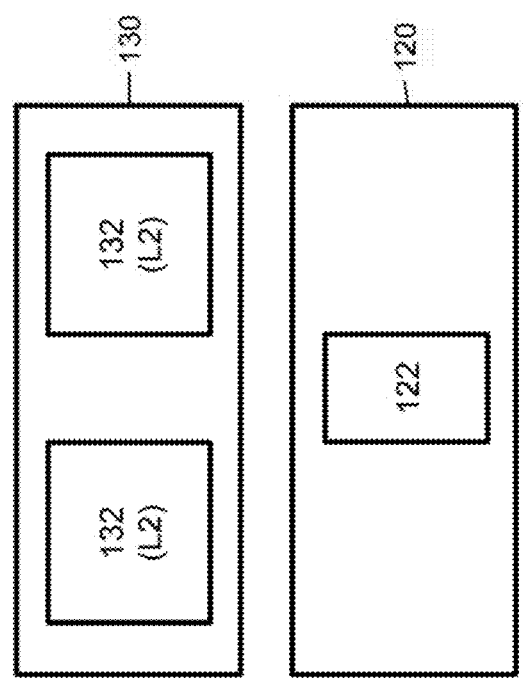
FIG. 4A
FIG. 4B

INTEGRATED CIRCUIT WITH 3D PARTITIONING

CROSS-REFERENCE TO RELATED APPLICATIONS

The present application is a non-provisional patent application claiming priority to European Patent Application No. EP 21150062.4, filed Jan. 4, 2021, the contents of which are hereby incorporated by reference.

FIELD OF THE DISCLOSURE

The present disclosure relates to integrated circuits and more particularly to three-dimensional (3D) integrated circuits.

BACKGROUND

A three-dimensional integrated circuit (3D-IC) is an integrated circuit (IC) manufactured by stacking silicon wafers or dies and interconnecting them vertically using so that they behave as a single device to achieve performance improvements at reduced power and smaller footprint than conventional ICs. The small footprint area and vertical interconnections between different dies allow for lesser interconnect delays and lower power consumption.

3D-ICs can be divided into 3D-stacked ICs; 3D systems on chip (3D-SoCs), which refers to stacking IC chips face-to-face using solder bump-to-chip pads connections; and monolithic 3D ICs, which use fabrication processes to realize 3D interconnects at the local levels of the on-chip wiring hierarchy resulting in direct vertical interconnects between device layers.

The trend of placing more and more processing cores on a single chip to boost the performance however exacerbates the so-called "memory wall" problem which describes the processor/memory performance gap. As each core enjoys a relatively narrower channel to the memory resources, the memory latency and bandwidth become insufficient to provide the processing cores with enough instructions and data to continue computation. As a result, the cores are always stalled waiting on memory which leads to performance loss and increased power consumption. This problem becomes particularly acute in highly parallel systems, but also occurs in platforms ranging from embedded systems to supercomputers and is not limited to multiprocessors.

SUMMARY

Embodiments of the present disclosure provide an integrated circuit design which overcomes the so-called memory wall problem. The present disclosure further provides an integrated circuit design enabling further performance scaling.

Various embodiments are described in the independent claims. The embodiments and features described in this specification that do not fall within the scope of the independent claims, if any, are to be interpreted as examples useful for understanding various embodiments.

According to a first example embodiment of the present disclosure, an integrated circuit includes:
 a first integrated circuit layer that includes processing cores;
 a second integrated circuit layer that includes memory arrays associated with processing cores, and
 an intermediate integrated circuit layer interconnected with the first and second integrated circuit layers and including memory control logic and interface circuitries for managing data exchange between the processing cores and the memory arrays.

In other words, the integrated circuit is a three-dimensional integrated circuit that includes one layer integrating the processing cores, another layer integrating the memory arrays associated with the processing cores, and a further layer integrating the memory control logic and interface circuitries for managing the data exchange between the processing cores and the memory arrays. The memory arrays associated with the processing cores may be the local memory, i.e. the cache memory, of the respective processing cores as well as the local memory shared by the cores, i.e. the system cache. Further, any software-controlled memory arrays associated with the processing cores such as scratchpad memories may also be integrated into the second layer. As a result, the integrated circuit is partition into three functional layers, i.e. a processing or compute layer that includes the processing cores, a memory layer that includes the memory arrays associated with the processing cores, and a data management layer that includes the memory control logic and interface circuitries for managing the data exchange between the processing cores and the memory arrays. This is in contrast to alternatives in which a two-layer functional split is employed where typically the processing cores are integrated into a separate integrated circuit layer from the memory arrays and their associated control logic and interface circuitries.

By introducing an additional functional partitioning between the memory arrays and the memory control logic and the interface circuitries, a more flexible integrated circuit design is enabled. As the intermediate layer is now purely reserved for the data management, more space is available for the design of the interconnects between the memory arrays with the processing cores. In other words, the density limitations observed in the alternatives are absent which allows for a more flexible interconnect design. Single interconnect pins may now be designed to correspond to the width of the interconnect without adding overhead. This ultimately leads to bandwidth increase and hence to improved performance and lower power consumption. Further, as more area is freed for the memory arrays, the memory capacity and/or increase the memory hierarchy may be further increased. Furthermore, independent optimization of the three functional layers is now enabled as the scaling of the various circuitries in the different functional layers with the various process technologies may now be done as needed and independently from one another.

According to an example embodiment, the intermediate integrated circuit layer includes a coherence logic circuitry for managing data consistency across the processing cores.

In other words, the additional functional partitioning allows integrating the coherence logic circuitry in the intermediate integrated circuitry layer as well. This allows for better and efficient data consistency management across the processing cores from a placement, routing, instruction flow, and data flow point of view.

According to an example embodiment, the intermediate integrated circuit layer further includes a communication network for interconnecting the processing cores with one or more external memories.

According to an example embodiment, the intermediate integrated circuit layer includes interface circuitries for managing the data exchange between the processing cores and the one or more external memories.

In other words, the additional functional partitioning allows integrating the communication network as well as any interface circuitries for interfacing with external memories in the intermediate layer as well. This can reduce unnecessary back and forth data transactions between the processing cores and external memory.

According to an example embodiment, the intermediate integrated circuit layer includes translation lookaside buffer (TLBs) for memory arrays.

The TLBs are also commonly referred to as address-translation cache which purpose is to translate a virtual memory address into a physical memory address. TLBs are sometimes used in order to achieve a reduction in memory array access time. In alternatives, TLBs are typically integrated into the compute layer together with the processing cores. Herein, however, the TLBs are integrated into the data management layer together with the other circuitries for controlling the memory access and data exchange management between the memory arrays and the processing cores. This allows for better and efficient data consistency management across the processing cores from a placement, routing, instruction flow and data flow point of view.

In other words, all circuitries used for managing the memory addressing and data exchange between the processing cores and the memory arrays are integrated into the intermediate or data management layer. A clear functional partitioning between compute, memory, and data management functionalities is thus realized.

According to an example embodiment, a respective memory array includes at least one of a layer one (L1), layer two (L2), and a higher layer cache.

In other words, one or more layers of the cache associated with a respective processing core, i.e. the so-called local memory or on-chip memory, is now integrated into the memory layer, i.e. in a layer separate from the compute and the data management layers. Different integration options are possible. For example, one processing core may have its associated cache starting from layer one and higher cache layers integrated into the memory layer, while another processing core may have only its layer two and higher cache layers integrated into the memory layer. This allows increasing the memory bandwidth as well as the cache capacity.

According to an example embodiment, the second integrated circuit layer includes a plurality of integrated circuit layers, wherein an integrated circuit layer from the plurality of integrated circuit layers includes one or more cache layers associated with one or more processing cores.

In other words, the memory layer may include not one but a plurality of integrated circuit layers with one or more cache layers being integrated across this plurality of integrated circuit layers. For example, cache layers L1 and L2 associated with one processing core may be integrated together with cache layers of L2 associated with another processing core. This allows further increasing the cache capacity per specific cache layers.

According to an example embodiment, the one or more cache layers are associated with a respective frequency domain.

In other words, cache layers associated with various processing cores but operating within the same frequency domain, i.e. at the same or similar clock frequency, may be integrated into a signal integrated circuit layer together. This allows grouping of the cache layers based on their frequency domain. This is especially beneficial where the compute layer that includes processing cores with different performance such as central processing unit (CPU), graphics processing unit (GPU), and a neural processing unit (NPU).

According to an example embodiment, the respective memory arrays are 3D stacked memories.

In other words, the cache memories associated with the various processing cores may be implemented as 3D stacked memories. For example, by integrating the cache layers associated with the processing cores and operating at the same or similar clock frequency and 3D stacking them, a compact integrated circuit design is achieved.

According to an example embodiment, the processing cores are characterized with different performance and/or functionality.

The processing cores may have different performance and/or functionality. That is, some processing cores may be optimized for high-performance while others are optimized for energy-efficiency. For example, one processing core may be a CPU, another processing core may be a GPU or a NPU, and so on.

According to an example embodiment, the integrated circuitry is a system on chip (SoC) or a system in package (SiP).

BRIEF DESCRIPTION OF THE DRAWINGS

Some example embodiments will now be described with reference to the accompanying drawings.

FIG. 1A shows various details of an integrated circuit, according to the prior art.

FIG. 1B shows various details of an integrated circuit, according to the prior art.

FIG. 2A shows various details of an integrated circuit, according to the prior art.

FIG. 2B shows various details of an integrated circuit, according to the prior art.

FIG. 3A shows various details of an integrated circuit, according to example embodiments.

FIG. 3B shows various details of an integrated circuit, according to example embodiments.

FIG. 4A shows various details of an integrated circuit, according to example embodiments.

FIG. 4B shows various details of an integrated circuit, according to example embodiments.

DETAILED DESCRIPTION

Figure 5B:
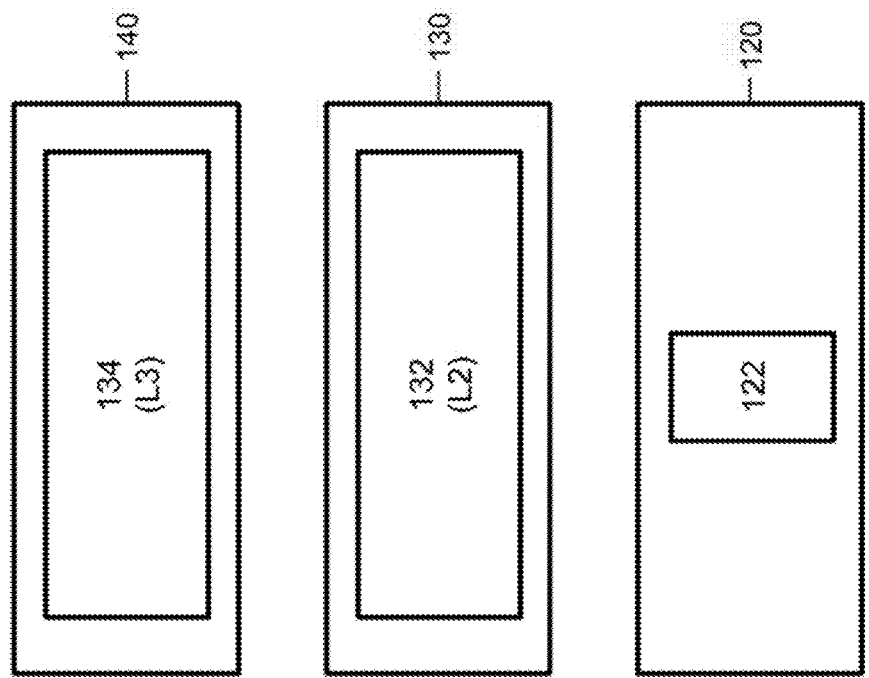
FIG. 5B shows various details of an integrated circuit, according to example embodiments.

FIG. 1A shows a side view and FIG. 1B a top view of an example of an integrated circuit 100 that includes a first integrated circuit layer 110 that includes a processing core 120 such as a CPU and a second integrated circuit layer 120 that includes the memory associated with the processing core 120, i.e. the CPU's local memory which includes the memory array 132 and its associated memory control logic 122. The interface circuitries for managing the data exchange between the processing core 120 and the memory array 132 may be located on the first layer or on the second layer in which case it may be integrated within the memory control logic 122.

In this figure, the memory array includes the L2 cache, split into two arrays with the memory control logic 122 placed in between them. This memory array 132 may optionally include L2 and higher cache layers such as L3, L4, and so on. For example, the memory array on the left of the control logic 122 may be the L2 cache and the memory array on the right of the control logic 122 may be the L3 cache.

Conventionally, any communication network for interconnecting the processing core 112 with an external memory, whether one or more, as well as the interface circuitries for managing the data exchange between the processing core and the external memory, are integrated either on the first layer 110 together with the processing core or on the second layer 120 together with the local memory and memory control logic. Further, any TLBs used by the local or the external memories are integrated into the first layer 110 or the second layer 120.

FIG. 2A shows a side view and FIG. 2B a top view of another example of an integrated circuit 100 that includes a first integrated circuit layer 110 with, in this case, two processing cores such as a CPU 112 and a GPU 114 and a second integrated circuit layer 120 that includes the memories associated with the respective processing cores, i.e. the CPU's local memory array 132 and its associated memory control logic 122 as well as the GPU's local memory array 134 and its associated memory control logic 124. Similarly to the circuit of FIGS. 1A and 1B, the interface circuitries for managing the data exchange between the processing cores 120 and the respective memory arrays 132 may be either located on the first layer 110 or on the second layer 120 in which case they may be integrated within their respective memory control logic 122 and 124.

In this figure, the memory arrays 132 and 134 include L2 cache with their respective memory control logics 122 and 124 placed in between them. Similarly to the example of FIGS. 1A and 1B, the memory arrays 132 and 134 may respectively include higher cache layers such as L3, L4, and so on. For example, one part of the memory array 132 may be the L2 cache and the other part the L3 cache. Further, in case coherence logic circuitry for managing the data consistency across the processing cores is used, such coherence logic circuitry is integrated into the first layer 110 together with the processing cores or in the second layer 120.

Any communication network for interconnecting the processing cores with an external memory, whether one or more, as well as the interface circuitries for managing the data exchange between the processing cores and the external memory, are integrated either in the first layer 110 together with the processing cores or in the second layer 120 together with the local memories and memory control logics. Any TLBs used by the local or the external memories are integrated into the first layer 110 or the second layer 120.

The memory organization in the integrated circuits shown in FIGS. 1A, 1B, 2A, and 2B, offers a limited bandwidth to the processing cores which causes increased memory latency and, therefore, stalling of the processing cores. This results in performance loss and increased power consumption. The particular integration of the processing cores and the memory control logic exhibits a tight coupling between the processing cores and the memory control logic which may restrict their performance optimization as they do not scale in the same way. Further, the communication network interconnecting the processing cores and the on-chip memory faces interconnect density issues. All these problems occur in platforms ranging from embedded systems to supercomputers and become particularly acute in highly parallel systems.

FIG. 3A shows a side view and FIG. 3B a top view of an integrated circuit 100 according to a first example embodiment. Herein, the integrated circuit 100 includes a first integrated layer 110 that includes the processing core 122 such as a CPU and a second integrated layer 130 that includes the CPU local memory 132, i.e. the memory array associated with the processing core. In this example, the memory array includes L2 cache, split into two memory arrays. However, the memory array 132 may further include higher cache layers such as L3, L4, and so on. For example, the memory array on the left may be the L2 cache and the memory array on the right may be the L3 cache.

Differently from the integrated circuit of FIGS. 1A and 1B, herein the memory control logic 122 and optionally the interface circuitries (not shown in the figure) for managing the data exchange between the processing core and the memory array are placed or integrated into a separate, intermediate layer 120. In this example embodiment, the intermediate layer is placed in between the first and the second layers 110 and 130.

This intermediate layer 120 may further include any communication networks used for interconnecting the processing core 112 with one or more external memories. The intermediate layer 120 may further include the interface circuitries used for managing the data exchange between the processing core 112 and the external memories. Any TLBs used by the local or the external memories may now also be integrated into the intermediate layer 120.

FIG. 4A shows a side view and FIG. 4B a top view of an integrated circuit 100 according to a second example embodiment. Herein, the integrated circuit 100 includes a first integrated layer 110 that includes two processing cores such as a CPU 112 and a GPU 114, and a second integrated layer 130 that includes the CPU local memory 132 and the GPU local memory 134. In this example, the memory arrays 132 and 134 respectively include L2 cache, however, they may further include higher cache layers such as L3, L4, and so on. For example, the memory array 132 associated with the CPU 112 may be split into two arrays respective that include L2 and L3 cache while the memory array 134 associated with the GPU 114 may include one cache layer, for example, L2 cache. Other integration schemes are also possible. For example, the memory array 132 may be split into two memory arrays respective that include L1 and L2 caches for the processing core 112, and the memory array 134 may be split into two arrays that include L2 to L4 caches for the processing core 114.

Similarly to the integrated circuit of FIGS. 3A and 3B, herein the memory control logics 122 and 124 for managing the respective memory arrays 132 and 134, and, optionally, their respective interface circuitries (not shown in the figure) for managing the data exchange between the processing cores and the respective memory arrays are now integrated into the intermediate layer 120. In this example embodiment, the intermediate layer is placed in between the first and the second layers 110 and 130.

Further, the coherence logic circuitry (not shown in the figure) used for managing the data consistency across the processing cores is may be integrated into the intermediate layer 120 as well.

Any communication network for interconnecting the processing cores with an external memory, whether one or more, as well as the interface circuitries for managing the data exchange between the processing cores and any external memory, may now be integrated either in the first layer 110 together with the processing cores or in the intermediate layer 120 together with the memory control logics and interface circuitries. Any TLBs used by the local or the external memories are typically integrated into the first layer 110 or the second layer 120.

Figure 5A:
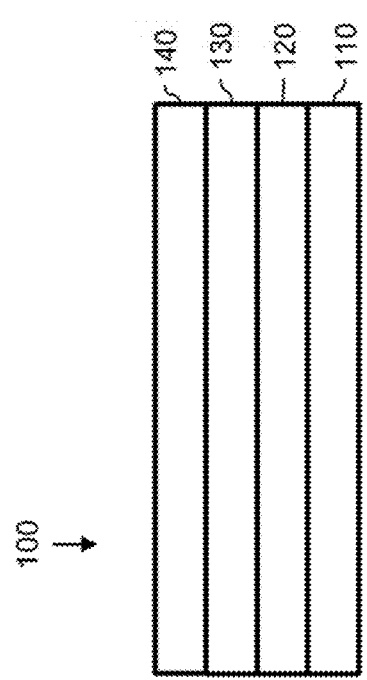
FIG. 5A shows various details of an integrated circuit, according to example embodiments.

FIG. 5A shows a side view and FIG. 5B a top view of an integrated circuit 100 according to a third example embodiment. Herein, the integrated circuit 100 includes a first integrated layer 110 that includes one processing core such as a CPU 112 and a second and a third integrated layers 130 and 140 that includes the local memory arrays 132 and 134 associated with the processing core, i.e. the CPU. In this example, the memory arrays 132 and 134 respectively include the L2 and 0.3 cache. This particular split of the L2 and L3 CPU cache into two separate layers is analogous to distributing the cache memory arrays based on the cache hierarchy. In other words, the respective cache layers may be integrated into separate layers. Thus, depending on the cache architecture, the cache memory arrays may be integrated into two, three, or more layers. This way of stacking the cache layers is commonly referred to as a three-dimensional, 3D, stacking. In other words, the group of layers integrating the various cache memory arrays form a 3D stacked memory.

This way of distributing the integration of the memory arrays over several integrated circuit layers may also be applied in the case where the first integrated circuit layer includes two or more processing cores. In this case, the distribution of the memory arrays associated with the respective processing cores may be done based on their operating frequency. For example, a CPU operating at a frequency in the range of GHz, for example at 2.5 GHz clock frequency, and, a GPU operating at the frequencies in the range of MHz, for example at 745 MHz clock frequency, will have their respective L3 cache and L2 cache operating at the same or similar frequency domain. In such a case, the L3 cache of the CPU and the L2 cache of the GPU may be integrated into one integrated circuit layer. Similarly, the L4 cache of the CPU and the L3 cache of the GPU may be integrated into another layer. Thus, such an integrated circuit will consist of four layers, i.e. one layer for the processing cores, two layers for the cache memory arrays, and an intermediate layer for the circuitries used for controlling the memory arrays and for managing the data exchange between the memory arrays and the processing cores.

Similarly to the integrated circuit of FIGS. 3A, 3B, 4A, and 4B above, herein the memory control logic 122 for managing the respective memory arrays 132 and 134, and, optionally, the interface circuitries for managing the data exchange between the respective processing cores and the memory arrays are integrated into a separate, intermediate layer 120. In this example embodiment, the intermediate layer is placed in between the first and the second layers 110 and 130.

Any communication network for interconnecting the processing cores with an external memory, whether one or more, as well as the interface circuitries for managing the data exchange between the processing cores and any external memory, may now be integrated either in the first layer 110 together with the processing cores or in the intermediate layer 120 together with the memory control logics and interface circuitries. Any TLBs used by the local cache or the external memories are typically integrated into the first layer 110 or the second layer 120.

Figure 6A:
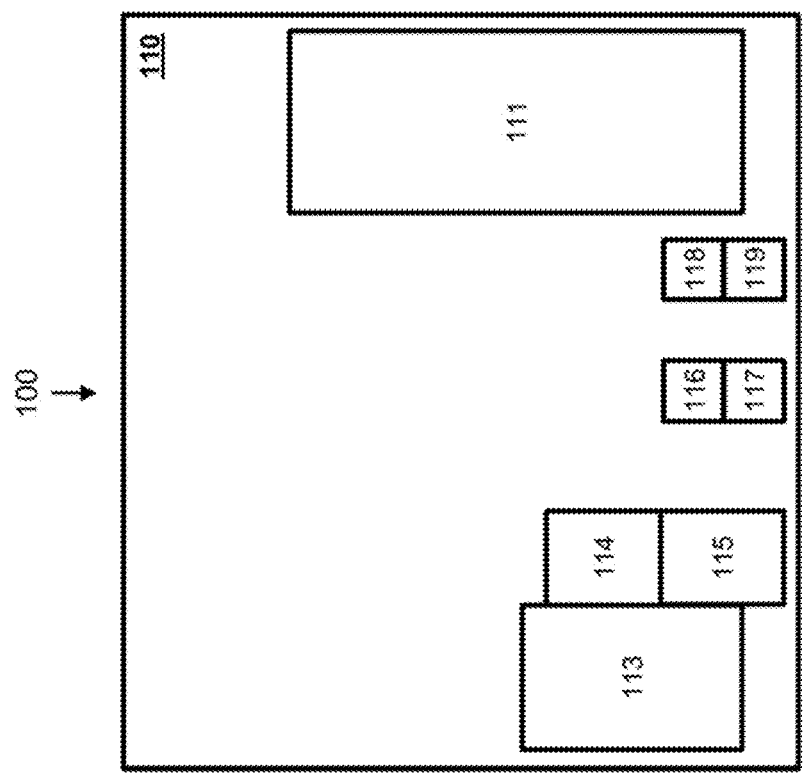
FIG. 6A shows various details of an implementation of an example SoC, according to example embodiments.
Figure 6B:
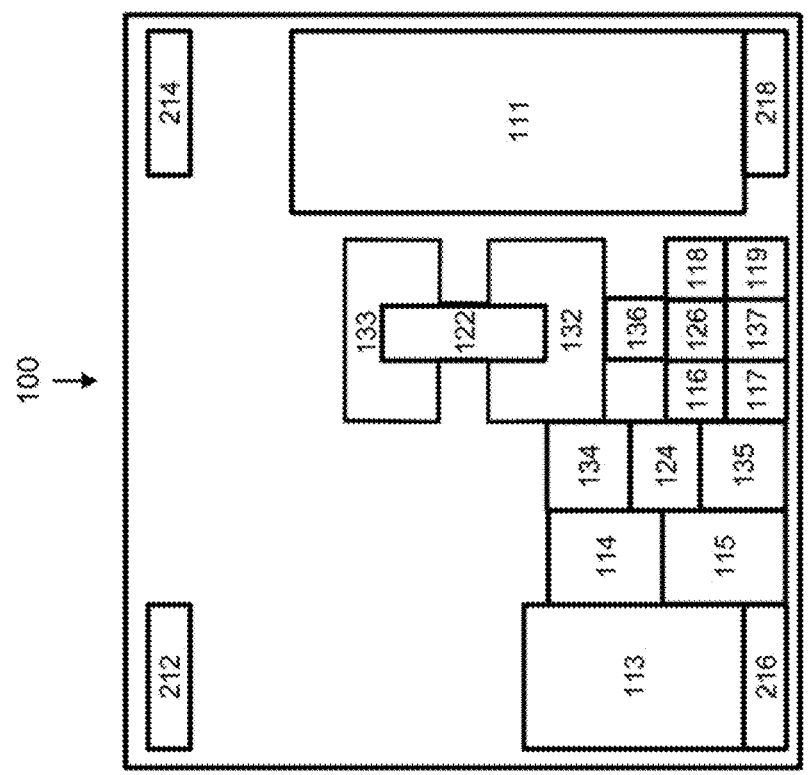
FIG. 6B shows various details of an implementation of an example SoC, according to example embodiments.
Figure 6D:
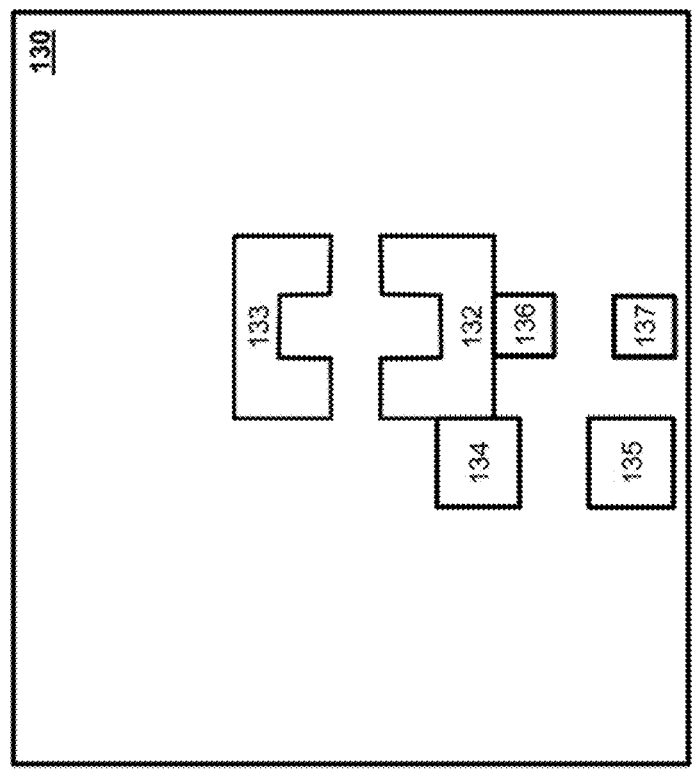
FIG. 6D shows various details of an implementation of an example SoC, according to example embodiments.
Figure 6C:
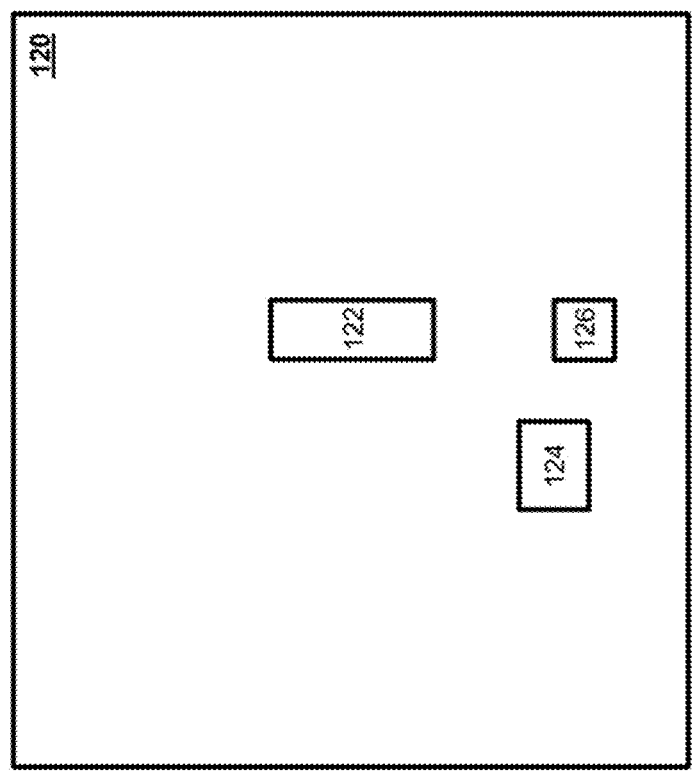
FIG. 6C shows various details of an implementation of an example SoC, according to example embodiments.

FIG. 6A shows an example of an architecture of a SoC, while FIGS. 6B to 6D show an implementation of the SoC of FIG. 6A, according to example embodiments. More particularly, FIG. 6A shows the various circuitries in the overall architecture of the SoC, while FIGS. 6B to 6D shows the integration of these circuitries in the various integrated circuit layers of the integrated circuit 100. Herein, the integrated circuit 100 includes three integrated circuit layers 110 to 130. The first layer 110 includes multiple processing cores with different processing capabilities. In this example, the first integrated layer includes a graphics processing unit, GPU 111, two high-performance processing cores 114-115, four energy-efficient processing cores 116-119, and a NPU 113. The second layer 130 includes the system cache memory arrays 132-133, the local memory arrays 134-135 for the high-performance cores 114-115 as well as the local memory arrays 136-137 for the energy-efficient processing cores 116-119. The third, intermediate layer 120 includes the control logics with their associated interface circuitries for the respective memory arrays. More particularly, the intermediate layer 120 includes the memory control logic and its associated interface circuitries 122 for managing the system cache array 132-133, the memory control logic and its associated interface circuitry 124 for managing the cache arrays 134-135, and the memory control logic and its associated interface circuitries 126 for managing the cache arrays 136-137.

Although not shown in FIG. 6C, the interface circuitries 212-218 for the double-data-rate dynamic-access memory may also be integrated into the second layer 120. This will further improve the efficiency of the data exchange between the processing cores and the memory arrays.

In all of the embodiments of FIGS. 3A to 6D, the intermediate layer acts as a data management layer where all memory control logics, their associated interface circuitries, coherence logic circuitries, TLBs, and any interface logic circuitries and communication network for managing and controlling the data exchange between the processing cores and any external memories may all be integrated.

Although example embodiments have been described, it will be apparent to those skilled in the art that the disclosure is not limited to the details of the foregoing illustrative embodiments, and that the present disclosure may be embodied with various changes and modifications without departing from the scope thereof. The present embodiments are therefore to be considered in all respects as illustrative and not restrictive, the scope of the disclosure being indicated by the appended claims rather than by the foregoing description, and all changes which come within the scope of the claims are therefore intended to be embraced therein.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several features recited in the claims. Any reference signs in the claims shall not be construed as limiting the respective claims concerned. The terms "first", "second", "third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments are capable of operating according to the present disclosure in other sequences, or in orientations different from the one(s) described or illustrated above.

What is claimed is:

1. An integrated circuit comprising:
   a first integrated circuit layer comprising a first processing core and a second processing core;
   a plurality of second integrated circuit layer comprising memory arrays associated with processing cores, wherein the memory arrays comprise local memories of or shared by the first processing core and the second processing core, wherein the plurality of second integrated circuit layers comprises a plurality of cache layers associated with the first processing core or the second processing core, wherein a first cache layer of the plurality of cache layers is associated with a first frequency domain, and wherein a second cache layer of the plurality of cache layers is associated with a second frequency domain; and
   an intermediate integrated circuit layer interconnected with the first integrated circuit layer and the plurality of second integrated circuit layers, wherein the intermediate integrated circuit layer comprises memory control logic and interface circuitries for managing data exchange between (i) the first processing core and the second processing core and (ii) the memory arrays.

2. The integrated circuit according to claim 1, wherein the intermediate integrated circuit layer comprises a coherence logic circuitry for managing data consistency across the first processing core and the second processing core.

3. The integrated circuit according to claim 1, wherein the intermediate integrated circuit layer further comprises a communication network for interconnecting (i) the first processing core and the second processing core with (ii) one or more external memories.

4. The integrated circuit according to claim 3, wherein the intermediate integrated circuit layer comprises interface circuitries for managing the data exchange between (i) the first processing core and the second processing core and (ii) the one or more external memories.

5. The integrated circuit according to claim 1, wherein the intermediate integrated circuit layer comprises translation lookaside buffers (TLBs) for memory arrays.

6. The integrated circuit according to claim 1, wherein the first processing core comprises a central processing unit (CPU) operating at a frequency range of GHz, and wherein the second processing core comprises a graphics processing unit (GPU) operating at a frequency range of MHz.

7. The integrated circuit according to claim 6, wherein the memory arrays of the first cache layer comprise a layer three (L3) cache of the CPU and a layer two (L2) cache of the GPU, and wherein the memory arrays of the second cache layer comprise a layer four (L4) cache of the CPU and a layer three (L3) cache of the GPU.

8. The integrated circuit according to claim 6, wherein the CPU operates at a frequency of 2.5 GHz, and wherein the GPU operates at a frequency of 745 MHz.

9. The integrated circuit according to claim 1, wherein the second integrated circuit layer further comprises one or more software controlled memories associated with the first processing core and the second processing core.

10. The integrated circuit according to claim 1, wherein the memory arrays comprise a system cache.

11. The integrated circuit according to claim 1, wherein the memory arrays are three-dimensional (3D) stacked memories.

12. The integrated circuit according to claim 1, wherein the first processing core and the second processing core are characterized with different performance or functionality.

13. A system on chip (SoC) comprising:
    a first integrated circuit layer comprising a first processing core and a second processing core;
    a plurality of second integrated circuit layer comprising memory arrays associated with processing cores, wherein the memory arrays comprise local memories of or shared by the first processing core and the second processing core, wherein the plurality of second integrated circuit layers comprises a plurality of cache layers associated with the first processing core or the second processing core, wherein a first cache layer of the plurality of cache layers is associated with a first frequency domain, and wherein a second cache layer of the plurality of cache layers is associated with a second frequency domain; and
    an intermediate integrated circuit layer interconnected with the first integrated circuit layer and the plurality of second integrated circuit layers, wherein the intermediate integrated circuit layer comprises memory control logic and interface circuitries for managing data exchange between (i) the first processing core and the second processing core and (ii) the memory arrays.

14. The SoC according to claim 13, wherein the intermediate integrated circuit layer comprises a coherence logic circuitry for managing data consistency across the first processing core and the second processing core.

15. The SoC according to claim 13, wherein the intermediate integrated circuit layer further comprises a communication network for interconnecting (i) the first processing core and the second processing core with (ii) one or more external memories.

16. The SoC according to claim 15, wherein the intermediate integrated circuit layer comprises interface circuitries for managing the data exchange between (i) the first processing core and the second processing core and (ii) the one or more external memories.

17. The SoC according to claim 13, wherein the intermediate integrated circuit layer comprises translation lookaside buffers (TLBs) for memory arrays.

18. The SoC according to claim 13, wherein the first processing core comprises a central processing unit (CPU) operating at a frequency range of GHz, and wherein the second processing core comprises a graphics processing unit (GPU) operating at a frequency range of MHz.

19. The SoC according to claim 18, wherein the memory arrays of the first cache layer comprise a layer three (L3) cache of the CPU and a layer two (L2) cache of the GPU, and wherein the memory arrays of the second cache layer comprise a layer four (L4) cache of the CPU and a layer three (L3) cache of the GPU.

20. A system in package (SiP) comprising:
    a first integrated circuit layer comprising a first processing core and a second processing core;
    a plurality of second integrated circuit layer comprising memory arrays associated with processing cores, wherein the memory arrays comprise local memories of or shared by the first processing core and the second processing core, wherein the plurality of second integrated circuit layers comprises a plurality of cache layers associated with the first processing core or the second processing core, wherein a first cache layer of the plurality of cache layers is associated with a first frequency domain, and wherein a second cache layer of the plurality of cache layers is associated with a second frequency domain; and an intermediate integrated circuit layer interconnected with the first integrated circuit layer and the plurality of second integrated circuit layers, wherein the intermediate integrated circuit layer comprises memory control logic and interface circuitries for managing data exchange between (i) the first processing core and the second processing core and (ii) the memory arrays.

* * * * *